United States Patent [19]

Preslar

[11] Patent Number: 4,731,589

[45] Date of Patent: Mar. 15, 1988

[54] CONSTANT CURRENT LOAD AND LEVEL SHIFTER CIRCUITRY

[75] Inventor: Donald R. Preslar, Plainsboro, N.J.

[73] Assignee: RCA Corporation, Somerville, N.J.

[21] Appl. No.: 889,209

[22] Filed: Jul. 25, 1986

[51] Int. Cl.[4] .......................... H03F 3/26; H03F 3/45
[52] U.S. Cl. .................................... 330/271; 330/257
[58] Field of Search .............. 330/252, 257, 271, 272, 330/274, 288

[56] References Cited

U.S. PATENT DOCUMENTS 3,887,880  6/1975  Leidich .............................. 330/257

*Primary Examiner*—Gene Wan
*Attorney, Agent, or Firm*—Stanley C. Corwin; Birgit E. Morris; Henry I. Schanzer

[57] ABSTRACT

Level shifter circuitry, as for an operational amplifier, imposes no current load on the preceding amplifier stage associated with its level shifter function. A common-collector-amplifier first transistor has base and emitter connections to the input and output terminals of the level shifter. A second transistor of similar conductivity type and common-collector forward current gain has its base electrode connected through a first current mirror amplifier to the input terminal of the level shifter and has its emitter electrode connected through a second current mirror amplifier to the output terminal of the level shifter. The first and second current mirror amplifiers have similar current gains. The first current mirror amplifier may also be incorporated in apparatus for supplying constant current loading to the preceding amplifier stage, to this end having a source of constant current connected to its input connection.

9 Claims, 1 Drawing Figure

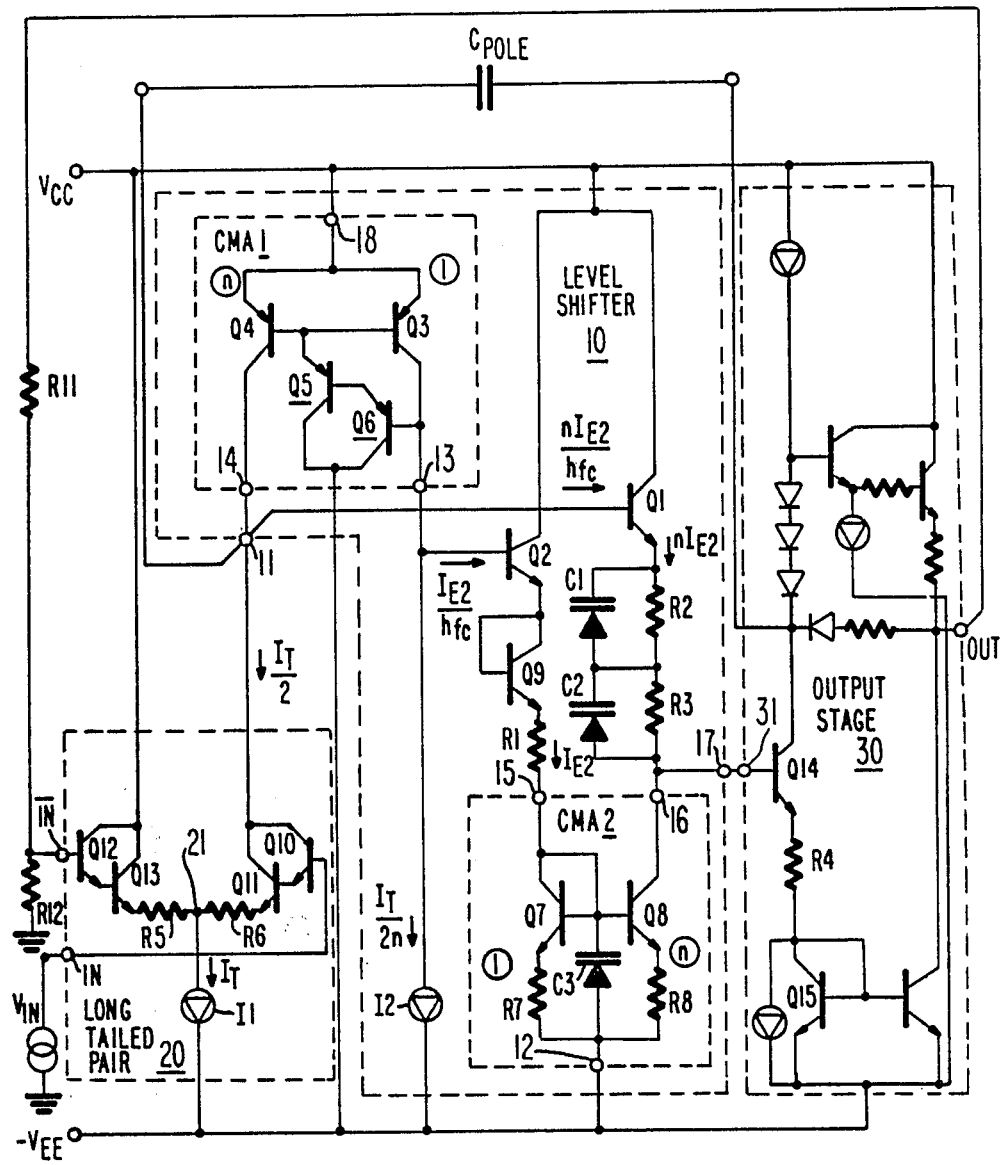

CONSTANT CURRENT LOAD AND LEVEL SHIFTER CIRCUITRY

The invention relates to constant current load and level shift circuitry as may be used, for example, in cascade connection between a differential-input amplifier input stage and a power output stage in an operational amplifier.

BACKGROUND OF THE INVENTION

A commonly used input stage in operational amplifiers is a differential-input amplifier of a sort known as the "long-tailed-pair." Differential input voltage is applied between the input electrodes of two transistors, the common electrodes of which connect to a common node and thence to a "tail connection" which includes a constant current sink (or source) that establishes the combined currents of the long-tailed-pair transistors. At least one of these transistors has its output electrode connected through a direct current conductive load to a first operating potential connection. The voltage appearing across this load responsive to differential input voltage is remote from a second operating potential. Level shifter circuitry is used to translate this response voltage closer to the second operating potential to facilitate its being applied to an ensuing amplifier stage, usually the output stage of the operational amplifier.

This basic operational amplifier configuration is used especially in monolithic integrated circuitry using bipolar transistors, where one conductivity type transistor (usually NPN) has good high-frequency response and the other conductivity type (usually PNP) has poor high-frequency response. Transistors of the former conductivity type are typically employed for all signal-processing functions, and transistors of the latter conductivity type are typically employed for establishing quiescent biasing conditions. The operational amplifier then exhibits overall frequency response limited only by the better-high-frequency-response transistors.

A concern in operational amplifier design is to minimize common-mode input current demands. Accordingly, the two transistors used in the long-tailed-pair configuration are sometimes field effect types, but more often they are each a composite transistor. For example, the composite transistor may be the well-known Darlington connection of two bipolar transistors. An operational amplifier is often arranged so as to apply signal with a direct potential component to the non-inverting terminal of the long-tailed-pair input stage, with voltage feedback from the operational amplifier output terminal being used to adjust the potential applied to the inverting terminal of the long-tailed-pair input stage. Ideally, presuming the transistors in the long-tailed-pair to be identically similar, adjustment is made to balance the quiescent current flows in the long-tailed-pair transistors when zero differential input voltage appears between the non-inverting and inverting input terminals. This provides for the lowest input voltage offset error in the long-tailed-pair input stage.

If the level shifter stage demands quiescent input current that disrupts the balance of the quiescent current flows in the long-tailed-pair, the voltage feedback from the operational amplifier output terminal will introduce a differential-input offset voltage to support this input current demand. This offset is accompanied by an undesirable loss in dynamic range wherein large differential input signals are asymmetrically clipped. The invention concerns a level shifter the quiescent input current demand of which is substantially zero-valued and consequently does not unbalance current flows in the long-tailed-pair.

This level shifter puts to dual use a first current mirror amplifier also employed to provide a constant current load to the output electrode of one of the long-tailed-pair transistors. In this specification and the claims that follow it, current mirror amplifiers will be considered to operate as transistors with predetermined common-emitter forward current gains, or $h_{fe}$'s, and to be of conductivity types corresponding to such transistors. The first current mirror amplifier, employed to provide a constant current load to the output electrode of a given one of the long-tailed-pair transistors is of a conductivity type opposite to that of those transistors, has its output terminal connected to the output electrode of the given one of the long-tailed-pair transistors, has its common terminal connected to a first operating potential connection and has its input terminal connected to a second operating potential connection via a current sink (or source) related to that in the tail connection of a long-tailed-pair.

SUMMARY OF THE INVENTION

A level shifter embodying the invention includes first and second bipolar transistors and a second current mirror amplifier, each of a conductivity type complementary to that of the first current mirror amplifier. Each of the first and second current mirror amplifiers has a well-defined input voltage between its common and input terminals over a wide range of input current levels. Typically, this input voltage is defined in terms of emitter-base junction offset voltage value(s). The common terminal of the first current mirror amplifier has the first operating potential applied thereto, and the common terminal of the second current mirror has the second operating potential applied thereto. The first transistor is operated as a common-collector amplifier. There is a first-transistor base connection between a node to which the output terminal of the first current amplifier connects (such as the node to which the output electrode of a long-tailed-pair transistor connects) and the base electrode of the first transistor. There is a first-transistor emitter connection between the emitter electrode of the first transistor and a node at the output of the level shifter, to which node the output terminal of said second current mirror amplifier connects. Either or both of the first-transistor base and emitter connections may include voltage-dropping resistance. The second transistor is operated as a common-collector amplifier. There is a second-transistor base connection between the input terminal of said first current mirror amplifier and the base electrode of said second transistor. There is a second-transistor emitter connection between the emitter electrode of the second transistor and the input terminal of the second current mirror amplifier. Usually, at least one of the second-transistor base and emitter connections includes current-limiting resistance. The first and second transistors have similar current gains, and the first and second current mirror amplifiers have similar current gains, which causes the level shifter to demand substantially no quiescent input current.

In certain preferred embodiments of the invention where voltage dropping resistance is included in at least one of the first-transistor base and emitter connections, current limiting will be included in the corresponding one(s) of the second-transistor base and emitter connections; and the scaling of the current limiting and voltage-dropping resistances is such as to translate voltage in prescribed relationship to the difference between the first and second operating potentials.

BRIEF DESCRIPTION OF THE DRAWING

The sole FIGURE is a schematic diagram of an operational amplifier wherein level shifting is accomplished in accordance with the invention.

DETAILED DESCRIPTION OF THE PREFERRED EMBODIMENT

The operational amplifier is assumed to be constructed in monolithic integrated circuitry using p-type silicon substrate.

Level shifter 10 includes first and second current mirror amplifiers CMA1 and CMA2 of complementary conductivity types having their common terminals 18 and 12 connected to receive a first operating potential $V_{CC}$ and to receive a second operating potential $-V_{EE}$, respectively. CMA1 has a current gain of value $-n$ between its input terminal 13 and output terminal 14. CMA2 also has a current gain of $-n$ between its input terminal 15 and its output terminal 16. The value n is a positive number, usually a small whole number—e.g., one or two. An n larger than unity reduces the power consumption in the quiescent biasing circuitry.

Level shifter 10 also includes first and second transistors Q1 and Q2, each of the same conductivity types as CMA2, each operated as a common-collector amplifier and each having the same common-collector current gain $h_{fc}$. Q1 and Q2 are shown as NPN transistors, as is usual for signal-amplifying transistors constructed on p-type silicon substrates.

The NPN transistors in the drawing use normal junction-isolated, vertical-structure bipolar transistors. PNP transistors Q3 and Q4 in CMA1 are lateral-structure bipolar transistors, having relative base-emitter junction areas in 1:n ratio to establish the current gain $-n$ as between the input terminal 13 and the output terminal 14 of CMA1. PNP transistors Q5 and Q6 are normally "substrate" transistors, vertical-structure transistors with collector regions in the p-type substrate. The resistors R1, R2, R3, R4, R7 and R8 are single-diffused type. NPN transistors Q7 and Q8 in CMA2 have emitter-base junction area in 1:n ratio and are provided respective emitter resistors R7 and R8 with respective resistances in n:1 ratio; these measures are taken to obtain the current gain of $-n$ between the input terminal 15 and output terminal 16 of CMA2.

CMA1 and CMA2 are both types of current mirror amplifier with well-defined input voltage over a wide range of input current. The input voltage of CMA1 between its common terminal 18 and input terminal 13 is the sum of the emitter-to-base voltage offsets $V_{BE3}$, $V_{BE5}$ and $V_{BE6}$ of its component transistors Q3, Q5 and Q6 and has a value fairly constant around minus two volts. The input voltage of CMA2 between its common terminal 12 and its input terminal 15 is larger than the 0.7 volts or so emitter-to-base voltage offset $V_{BE7}$ of diode-connected NPN transistor Q7 by a relatively small voltage drop $V_{R7}$ across resistance R7.

The connection of the base electrode of Q2 to the input terminal 13 of CMA1 places its voltage at $V_{CC}-V_{BE3}-V_{BE5}-V_{BE6}$. The emitter voltage of Q2 is lower by its emitter-to-base voltage $V_{BE2}$. A diode-connected NPN transistor Q9 has a similar-valued emitter-to-base voltage drop thereacross. The voltage $V_{R1}$ impressed across resistor R1 in the emitter connection of Q2 has a value as follows $$V_{R1}=V_{CC}+V_{EE}-V_{BE3}-V_{BE5}-V_{BE6}-V_{BE2}-V_{BE9}-V_{BE7}-V_{R7}.$$

This causes an emitter current flow $I_{E2}$ from the emitter electrode of Q2 as follows, where $R_1$ is the resistance of R1.

$$I_{E2}=(V_{CC}+V_{EE}-V_{BE3}-V_{BE5}-V_{BE6}-V_{BE2}-V_{BE9}-V_{BE7}-V_{R7})/R_1$$

To support its emitter current flow $I_{E2}$, Q2 demands a base current $I_{E2}/h_{fc}$ from the input terminal 13 of CMA1. $I_{E2}$ is identical to the input current flowing through input terminal 15 of CMA2.

An output current $nI_{E2}$ is demanded at the output terminal 16 of CMA2. Current demand at the output terminal 17 of level shifter 10 is relatively small. So the $nI_{E2}$ current is supplied from the emitter electrode of Q1 via voltage-dropping resistors R2 and R3. To support this $nI_{E2}$ emitter current demand Q1 in turn demands a base current $nI_{E2}/h_{fc}$ at the input terminal 11 of level shifter 10.

This base current demand is met by current flow from the output terminal 14 of CMA1. This current flow is n times as large as the $I_{E2}/h_{fc}$ current flow from the input terminal 13 of CMA1 to the base electrode of Q2, owing to CMA1 current gain being $-n$. Accordingly, level shifter 10 can be considered to place no substantial quiescent current load on the source driving its input terminal 11.

CMA1 is shown as providing a constant current load to a Darlington composite transistor connection of NPN transistor Q10 and Q11 which is in a long-tailed-pair configuration 20 with another Darlington composite transistor connection of Q12 and Q13. These Darlington composite transistors function like high-current-gain NPN transistors, so are considered to be NPN in conductivity type. The emitter electrodes of Q11 and Q13 connect through like-valued resistors R5 and R6 respectively to a node 21, from which node 21 a constant-valued tail current $I_T$ is demanded by a current generator I1 connected to sink current. This current generator I1 typically comprises a common-emitter-amplifier NPN transistor with forward-base bias potential applied thereto, with emitter electrode connected to the second-operating-potential $V_{EE}$ bus through an emitter resistor R9 (not shown), and with collector electrode connected to node 21. The collector electrodes of Q10 and Q11 in Darlington composite transistor connection are supplied a constant current load from the output terminal 14 of CMA1. The constant current supplied has a value $I_T/2$, responsive to a current $I_T/2n$ demanded from the input terminal 13 of CMA1 by a current generator I2. Current generator I2 typically comprises a common-emitter-amplifier NPN transistor with the same forward base bias as the NPN transistor in current generator I1, with an emitter-base junction area 2n times smaller than that of the NPN transistor in current generator I1, with emitter electrode connected to the second-operating-potential $-V_{EE}$ bus through an emitter resistor R10 (not shown) that has 2n times the resistance of R9, and with collector connected to the input terminal 13 of CMA1.

When the differential input voltage between terminals IN and $\overline{\text{IN}}$ is zero-valued, since the Darlington composite transistor connections of Q10 and Q11 and of Q12 and Q13 are identical in geometry and since R5 and R6 have equal resistance values, the combined collector currents of Q10 and Q11 equal the combined collector currents of Q12 and Q13. The $I_T/2$ combined quiescent collector currents of Q12 and Q13 support emitter current from Q13 that supplies one half of the quiescent $I_T$ tail current demand by current source I1, and the $I_T/2$ combined quiescent collector currents of Q10 and Q11 support emitter current from Q11 that supplies the other half of the quiescent $I_T$ tail current demand.

The output stage 30 of the operational amplifier shown in the drawing is of a sort described by D. R. Preslar, the inventor here, in U.S. Pat. No. 4,442,409 issued 10 April 1984 and entitled "PUSH-PULL NON-COMPLEMENTARY TRANSISTOR AMPLIFIER", incorporated herein by reference. Output stage 30 provides an inverted output voltage response at terminal OUT to the voltage supplied to its input terminal from the output terminal 17 of level shifter 10. The primary pole capacitor $C_{POLE}$ for the operational amplifier is normally external to the integrated circuit that the operational amplifier is constructed on. $C_{POLE}$ connects from a point in output stage 30 to the input terminal 11 of level shifter 10. The quiescent input voltage that is to be maintained at input terminal 31 of output stage 30 equals $-V_{EE}$, plus the emitter-to-base offset voltage $V_{BE14}$ of NPN transistor Q14, plus the relatively small potential drop $V_{R4}$ across an emitter-stablization resistor R4, plus the emitter-to-base offset $V_{BE15}$ of diode-connected transistor Q15.

The operational amplifier overall voltage feedback operates to maintain this voltage, so as to bias the output stage 30 in the middle of its linear output voltage range. The overall voltage feedback shown in the drawing is provided by resistors R11 and R12 in voltage divider connection between terminals OUT and $\overline{\text{IN}}$ of the operational amplifier. Resistors R11 and R12 are located external to the integrated circuit that the operational amplifier is constructed on and have respective resistances $R_{11}$ and $R_{12}$. This overall voltage feedback connection conditions the operational amplifier to operate as a voltage amplifier with closed-loop voltage gain $(R_{11}/R_{12})+1$. Other overall feedback connections are possible for different operational amplifier uses. The operational amplifier may be operated as a voltage follower, for example, by omitting R12 so voltage division between terminals OUT and $\overline{\text{IN}}$ does not take place.

It is desirable in this operational amplifier that level shifter 10 shifts from a voltage just smaller than the first operating potential $V_{CC}$ at its input terminal 11 to this one-and-a-half volt or so potential maintained at input terminal 31 of output stage 30. The combined resistance of R2 and R3 are chosen so that the voltage drop appearing across them responsive to $nI_{E2}$ current flow through them fulfills this desire. Having terminal 11 close to $V_{CC}$ allows the long-tailed-pair 20 to have greater common mode input voltage range.

The voltage $V_{11}$ appearing at input terminal 11 of level shifter 10 has the following value, where $V_{BE1}$ is the emitter-to-base offset voltage of Q1, $V_{R2}$ is the voltage drop across R2, and $V_{R3}$ is the voltage drop across R3.

$$V_{11} = V_{BE1} + V_{R2} + V_{R3} + V_{BE14} + V_{R4} + V_{BE15} - V_{EE}$$

The resistance of the serially connected resistors R2 and R3 is the sum of their respective resistances R2 and R3. If $(R_2+R_3)$ is chosen to be $R_1/n$, where $R_1$ is the resistance of R1, $V_{R2}+V_{R3}$ will equal the volta $V_{R1}$ imposed on R1. This is because CMA2 draws a current through R2 and R3 to its output terminal 16 that is n times as large as the current flowing through R1 to CMA2 input terminal 15. The value of $V_{R1}$ has been previously determined to be as follows.

$$V_{R1} = V_{CC} + V_{EE} - V_{BE3} - V_{BE5} - V_{BE6} - V_{BE2} - V_{BE9} - V_{BE7} - V_{R7}$$

Substituting this value of $V_{R1}$ for $V_{R2}+V_{R3}$ in the previous equation, the following result is obtained.

$$V_{11} = V_{CC} + V_{BE1} + V_{BE14} + V_{BE15} - V_{BE3} - V_{BE5} - V_{BE6} - V_{BE2} - V_{BE9} - V_{BE7} + V_{R4} - V_{R7}$$

The emitter-base junction area of Q1 and Q2 may be scaled in n:1 ratio, so their n:1 emitter currents cause similar-value $V_{BE1}$ and $V_{BE2}$. This simplifies the expression for $V_{11}$ as follows $$V_{11} = V_{CC} + V_{BE14} + V_{BE15} - V_{BE3} - V_{BE5} - V_{BE6} - V_{BE9} - V_{BE7} + V_{R4} - V_{R7}$$

Arrangements can be made in the current levels in output stage 30 input circuitry such that $V_{R4}$ equals $V_{R7}$. Then Q14 and Q15 emitter-base junction area may be scaled respective to Q9 and Q7 emitter-base junction areas such that $V_{BE14}+V_{BE15}$ equals $V_{BE7}+V_{BE9}$. This simplifies the expression for $V_{11}$ as follows.

$$V_{11} = V_{CC} - V_{BE3} - V_{BE5} - V_{BE6}$$

Note this places the quiescent potentials at the input terminal 13 and the output terminal 14 of CMA1 at the same value, which best preserves CMA1 current gain being determined by Q3 and Q4 area ratio. Note also that the offset of input terminal 11 of level shifter 10 from $V_{CC}$ is unaffected by change in the operating voltages $V_{CC}$ and $-V_{EE}$.

The voltage-dropping resistance between Q1 emitter electrode and terminal 17 is provided by the series connection of two resistors R2 and R3, in order that the voltage drops across each resistor is less than the reverse-breakdown voltage of a PN junction. This facilitates capacitors C1 and C2 being used to by-pass resistors R2 and R3, respectively, at higher frequencies. This is done to improve open-loop frequency response in the operational amplifier. Each of these capacitors, and a capacitor C3 used to by-pass CMA2 so high frequencies are kept out of the constant current load for the long-tailed-pair 20, is formed from a reverse-biased PN junction. To get the low series resistance required for an effective by-pass capacitor, capacitors C1, C2 and C3 can have, by way of example, the following type of construction. An N-type isolation tub with underlying N+ pocket is formed by P+ isolation diffusions into N-epitaxial layer, as would be done in making the usual vertical-structure NPN transistor. An N+ diffusion from the top surface is made to the N+ pocket and is ohmically contacted to provide one plate of the capacitor. A P+ diffusion from top surface, made at the same time as the P+ diffusions used to define N-type isolation tubs, extends down to the N+ pocket and is ohmically contacted to provide the other plate of the capacitor.

Instead of employing emitter resistances $R_1$ and $(R_2+R_3)$ with Q2 and Q1, similarly scaled base resistances might be employed instead. Resistance values would tend to be scaled upward by $h_{fe}$, so a double-diffusion or pinch construction might be employed. However, voltage drops across base resistances would be harder to track because of the greater dependency on Q1 and Q2 $h_{fe}$ values tracking. Q2 and Q1 may also employ both emitter resistances and base resistances in other embodiments of the invention. In low-voltage operational amplifiers where $V_{CC}$ and $-V_{EE}$ vary by only a few emitter-to-base offset voltages, linear-resistance resistors may be omitted, with all voltage offsets being developed across semiconductor junctions in still other embodiments of the invention. Variants of the level shifter 10 in which $(R_2+R_3)$ is scaled respective to $R_1$ to place its output voltage about midway between $-V_{EE}$ and $V_{CC}$ operating voltages are embodiments of the invention, also, which are useful with other known types of output amplifier stage.

In operational amplifiers where extended-high-frequency open-loop response is not a primary concern, current source I2 can be provided from the collector electrodes of Q12 and Q13 connecting to input terminal 13 of CMA1, rather than connecting directly to the $+V_{CC}$ rail as shown. The current gains of CMA1 and of CMA2 should then each be $-1$.

What is claimed is:

1. A level shifter comprising:
   first and second terminals for receiving first and second operating potentials respectively;
   a level-shifter input terminal;
   a level-shifter output terminal;
   first and second transistors of a first conductivity type, having respective collector electrodes each connected to said first terminal and having respective base and emitter electrodes between which current gains each equal to $h_{fe}$ are exhibited;
   first-transistor base-connection means for providing a direct-current-conductive path and a prescribed voltage between said level-shifter input terminal and the base electrode of said first transistor;
   first-transistor emitter-connection means for providing a direct-current conductive path and a prescribed voltage between the emitter electrode of said first transistor and said level-shifter output terminal;
   a first current mirror amplifier being of a second conductivity type complementary to said first conductivity type, having an input terminal, having an output terminal connected to said level-shifter input terminal, having a common terminal connected to said first terminal, and exhibiting a current gain of $-n$ between its input and output terminals, n being a positive number;
   second-transistor base-connection means for providing a direct-current-conductive path and a prescribed voltage between the input terminal of said first current mirror amplifier and the base electrode of said second transistor;
   a second current mirror amplifier being of said first conductivity type, having an input terminal, having an output terminal connected to said level-shifter output terminal, having a common terminal connected to said second terminal, and exhibiting a current gain of $-n$ between its input and output terminals; and
   second-transistor emitter-connection means for providing a direct-current-conductive path and a prescribed voltage between the emitter electrode of said second transistor and the input terminal of said second current mirror amplifier.

2. A level shifter as set forth in claim 1 in combination with:
   a third transistor having a collector electrode connected to said level-shifter input terminal of said level shifter, and having base and emitter electrodes between which input signal is applied; and
   a constant current generator connected to the input terminal of said first current mirror amplifier for supplying a constant current collector load to said third transistor.

3. A level shifter as set forth in claim 1 wherein at least one of said second-transistor base-connection means and said second-transistor emitter-connection means includes a current-limiting resistor.

4. A level shifter as set forth in claim 3 wherein at least one of said first-transistor base-connection means and said first-transistor emitter-connection means includes a voltage-dropping resistor.

5. A level shifter as set forth in claim 4 wherein said voltage-dropping resistor has a resistance $(1/n)$ times that of said current-limiting resistor, for causing the voltage-dropping resistor to have a voltage drop thereacross equal to the voltage impressed on said current-limiting resistor.

6. A level shifter as set forth in claim 1 and further including a differential amplifier having a non-inverting input terminal, an inverting input terminal and an output terminal;
   means connecting the output terminal of said differential amplifier to said output terminal of said first current mirror amplifier; and
   an output stage with inverting voltage gain characteristic having an input terminal connected at said level-shifter output terminal and having an output terminal connected at said differential amplifier output terminal.

7. A level shifter as set forth in claim 6 further including:
   a frequency compensation capacitor connected from a point in said output stage after inverting voltage gain has been provided to said level shifter input terminal.

8. A level shifter as set forth in claim 7 further including:
   an overall voltage feedback connection from said output terminal of said output stage to said differential amplifier inverting input terminal, for adjusting the direct potential at said differential amplifier inverting input terminal to the same value as the direct potential at said differential amplifier non-inverting input terminal.

9. The level shifter as claimed in claim 6 wherein said differential amplifier includes first and second differential input-amplifier devices having respective input electrodes connected respectively to said differential amplifier inverting input terminal and to said differential amplifier non-inverting input terminal, having respective output electrodes connected respectively to said first terminal and to said level-shifter input terminal, and having respective common electrodes connected at a common connection, which common connection conducts a common current supplied by a first current generator connected between said common connection and said second terminal; and further including a second current generator of a current 1/2n times as large as said common current, connected between the input terminal of said first current mirror amplifier and said second terminal.

* * * * *